(12) United States Patent
Hashitani

(10) Patent No.: US 8,236,648 B2
(45) Date of Patent: Aug. 7, 2012

(54) TRENCH MOS TRANSISTOR AND METHOD OF MANUFACTURING THE SAME

(75) Inventor: Masayuki Hashitani, Chiba (JP)

(73) Assignee: Seiko Instruments Inc., Chiba (JP)

( * ) Notice: Subject to any disclaimer, the term of this patent is extended or adjusted under 35 U.S.C. 154(b) by 66 days.

(21) Appl. No.: 12/178,328

(22) Filed: Jul. 23, 2008

(65) Prior Publication Data

US 2009/0026538 A1    Jan. 29, 2009

(30) Foreign Application Priority Data

Jul. 27, 2007 (JP) ................................ 2007-195493
Jul. 3, 2008 (JP) ................................ 2008-174498

(51) Int. Cl.
*H01L 21/336* (2006.01)
*H01L 29/78* (2006.01)
*H01L 21/8236* (2006.01)

(52) U.S. Cl. ........ 438/259; 438/284; 438/302; 438/306; 438/389; 438/524; 438/525; 438/589; 257/343; 257/611; 257/E29.091

(58) Field of Classification Search .................. 257/343, 257/611, E29.091; 438/524, 525, 259, 284, 438/302, 306, 389, 589

See application file for complete search history.

(56) References Cited

U.S. PATENT DOCUMENTS

| | | | |
|---|---|---|---|
| 4,835,585 A * | 5/1989 | Panousis | 257/332 |
| 4,979,004 A * | 12/1990 | Esquivel et al. | 257/316 |
| 5,371,024 A | 12/1994 | Hieda et al. | |
| 6,201,278 B1 * | 3/2001 | Gardner et al. | 257/330 |
| 6,452,231 B1 * | 9/2002 | Nakagawa et al. | 257/343 |
| 6,501,146 B1 | 12/2002 | Harada | |
| 2002/0179980 A1 * | 12/2002 | Yagishita et al. | 257/384 |
| 2004/0065919 A1 * | 4/2004 | Wilson et al. | 257/329 |
| 2004/0155259 A1 * | 8/2004 | Taniguchi et al. | 257/192 |
| 2005/0032275 A1 * | 2/2005 | Toda et al. | 438/123 |

(Continued)

FOREIGN PATENT DOCUMENTS

JP    05160401 A  *  6/1993
JP    2006-294645 A    10/2006

OTHER PUBLICATIONS

Office Action from co-pending U.S. Appl. No. 12/027,655, dated Dec. 10, 2009, 14 pages.

(Continued)

*Primary Examiner* — N Drew Richards
*Assistant Examiner* — John P Dulka
(74) *Attorney, Agent, or Firm* — Brinks Hofer Gilson & Lione

(57) ABSTRACT

Provided is a semiconductor device formed with a trench portion for providing a concave portion having a continually varying depth in a gate width direction and with a gate electrode provided within the trench portion and on a top surface thereof via a gate insulating film. Before the formation of the gate electrode, an impurity is added to at least a part of the source region and the drain region by ion implantation from an inner wall of the trench portion, and then heat treatment is performed for diffusion and activation to form a diffusion region from the surface of the trench portion down to a bottom portion thereof. Current flowing through a top surface of the concave portion of the gate electrode at high concentration can flow uniformly through the entire trench portion.

7 Claims, 5 Drawing Sheets

U.S. PATENT DOCUMENTS

2005/0285210 A1 12/2005 Ishibashi et al.
2006/0001085 A1 1/2006 Risaki
2006/0154440 A1 7/2006 Lanzerotti et al.
2006/0223253 A1* 10/2006 Risaki ........................ 438/197
2007/0249123 A1* 10/2007 Chou et al. .................. 438/270
2008/0109770 A1* 5/2008 Kim et al. ........................ 716/4

OTHER PUBLICATIONS

Office Action from co-pending U.S. Appl. No. 12/027,655, dated Oct. 27, 2010, 10 pages.
Office Action from co-pending U.S. Appl. No. 12/027,655, dated Apr. 8, 2011, 14 pages.

* cited by examiner

FIG. 4A
RELATED ART
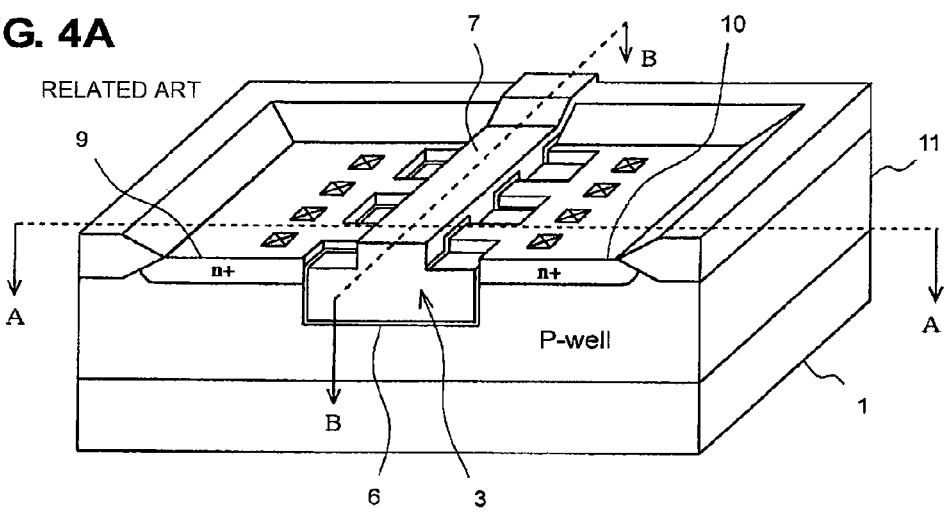
FIG. 4B
RELATED ART
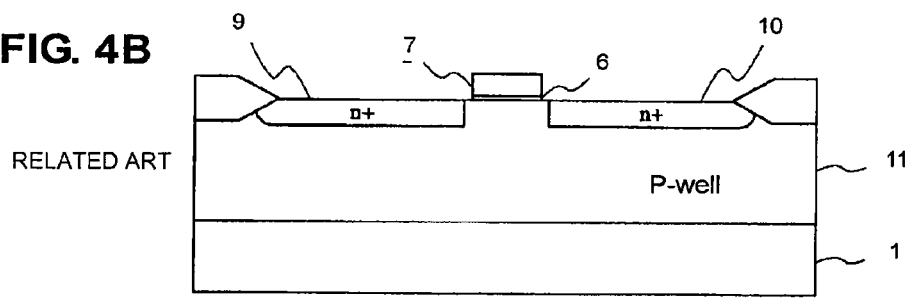
FIG. 4C
RELATED ART
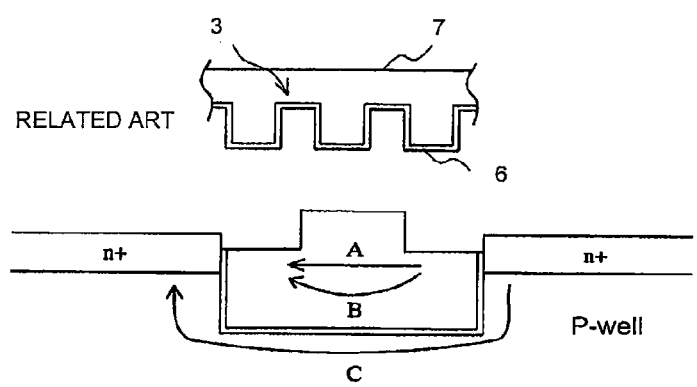
RELATED ART
FIG. 4D

TRENCH MOS TRANSISTOR AND METHOD OF MANUFACTURING THE SAME

RELATED APPLICATIONS

This application claims priority under 35 U.S.C. §119 to Japanese Patent Application Nos. JP2007-195493 filed on Jul. 27, 2007, and JP2008-174498 filed on Jul. 3, 2008, the entire contents of which are hereby incorporated by reference.

BACKGROUND OF THE INVENTION

1. Field of the Invention

The present invention relates to a semiconductor device including a MOS transistor to which high driving performance is required, and relates to a method of manufacturing the semiconductor device.

2. Description of the Related Art

A MOS transistor is a core electronic element in electronics. It is important to achieve miniaturization of the MOS transistor and high driving performance thereof. One of methods of imparting high driving performance to the MOS transistor is expansion of a gate width to reduce ON resistance. However, there is a problem that a large gate width needs a wide occupation area for the MOS transistor. As a solution thereto, there is proposed a technology by which a large gate width is given while suppressing increase of the occupation area of the MOS transistor. (For example, see JP 2006-49826 A)

Hereinafter, a conventional semiconductor device will be described with reference to FIGS. 4A to 4D. As shown in a perspective view of FIG. 4A, the conventional semiconductor device includes a trench structure 3 provided in a well 11 and a gate electrode 7 provided in a trench portion having the trench structure 3 and on a top surface of a planar portion having no trench via a gate insulating film 6. In a surface portion of the well 11, one side of the gate electrode 7 is provided with a source region 9 and the other side thereof is provided with a drain region 10. FIG. 4B is an A-A sectional view taken along the line A-A of FIG. 4A and shows the planar portion. FIG. 4C is a B-B sectional view taken along the line B-B of FIG. 4A in a direction perpendicular to a channel. As shown in the B-B sectional view, the gate electrode 7 is formed in the trench portion 3, and therefore a total extension length of a curve formed by the gate insulating film 6 located under the gate electrode 7 is a gate width.

As described above, in this technology, since the gate portion has the trench structure including a convex portion and a concave portion, the actual gate width can be larger than the width of the gate electrode simply made on a flat surface thereof. Accordingly, the ON resistance per unit area can be reduced without lowering withstanding voltage of the MOS transistor.

The inventor of the present invention has found a problem that in the structure of the semiconductor device described above, an actual driving performance can not reach the expected driving performance. It has also been found that the driving performance varies depending on the gate length and tends to be low in a short gate length device.

It is presumed that this phenomenon is caused by non-uniform current flow in the channel generated between the source and the drain: most current flows along path A which is a planar portion where the trench portion 3 is not formed; a little current flows along path B which is a side surface of the trench portion 3, which is parallel to the channel in the direction connecting the source and the drain, and along path C which is a bottom surface of the trench portion 3, as shown in FIG. 4D. Accordingly, the current tends to concentrate to the path A in the short gate length device, which is conceived to be a cause of lowering the driving performance in the short gate length device.

SUMMARY OF THE INVENTION

It is an object of the present invention to improve driving performance of a semiconductor device having a trench structure.

In order to solve the above-mentioned problems, the present invention employs the following means:

(1) a semiconductor device including: a first conductivity type semiconductor substrate; a trench structure formed on the first conductivity type semiconductor substrate and having a continuously varying depth in a gate width direction; a gate electrode formed within a trench portion defined by the trench structure and formed on a top surface of a planar portion via a gate insulating film; a source region of a second conductivity type, formed on one side of the gate electrode; and a drain region of the second conductivity type, formed on another side of the gate electrode, in which parts of the source region and the drain region which sandwich the trench portion and face each other have a depth from a top surface of the trench structure to one of a bottom portion thereof and a deeper position;

(2) a semiconductor device including: a first conductivity type semiconductor substrate; a source region of a second conductivity type and a drain region of the second conductivity type, which are disposed apart from each other in a vicinity of a surface of the first conductivity type semiconductor substrate; a planar portion being flat and disposed between the source region and the drain region to become a first channel region; a trench portion with a constant depth, disposed along with the planar portion and having a side surface and a bottom surface serving as a second channel region; a gate insulating film provided to a surface of the planar portion and a surface of the trench portion; and a gate electrode provided on the gate insulating film, in which parts of the source region and the drain region which face each other via the trench portion include a diffusion region having a depth from a top surface of the trench structure to one of a bottom portion thereof and a deeper position; and (3) a method of manufacturing a semiconductor device, including: preparing a semiconductor substrate; removing a part of a region to become a channel region of the semiconductor substrate from a surface thereof to an inside thereof and forming a trench having a side surface and a bottom surface to dispose a planar portion and a trench portion; forming an oxide film on a surface of the trench portion and a surface of the planar portion; applying a resist material and performing patterning so that an impurity can be introduced from a top surface of the trench to the bottom surface thereof in a source region direction and a drain region direction; ion-implanting an impurity for forming a first source region and a first drain region with the semiconductor substrate being rotated; removing the resist material and the oxide film and forming a gate insulating film; depositing polycrystalline silicon to form a gate electrode; and forming a second source region and a second drain region to sandwich the gate electrode therebetween.

According to the present invention, in a part of the source region and a part of the drain region of the semiconductor device described above, formation of the deep diffusion regions ranging from the top surface of the trench portion to the bottom portion thereof is enabled through application and patterning of a photoresist film, and ion implantation to the trench portion before the formation of the gate electrode. Accordingly, current concentration at the top of a concave portion having a continuingly varying depth in the gate width direction can be reduced, and the current flow along the side surface and the bottom surface of the trench portion can also be enabled, enhancing the driving performance of the semiconductor device.

BRIEF DESCRIPTION OF THE DRAWINGS

In the accompanying drawings:

FIGS. 4A to 4D are a schematic view and sectional views showing a related art and a problem thereof.

DETAILED DESCRIPTION OF THE PREFERRED EMBODIMENTS

Hereinafter, embodiments of the present invention will be described with reference to the drawings.

FIGS. 1A to 1H are schematic sectional views of a process sequence flow showing a method of manufacturing a semiconductor device according to a first embodiment of the present invention.

Figure 1A:
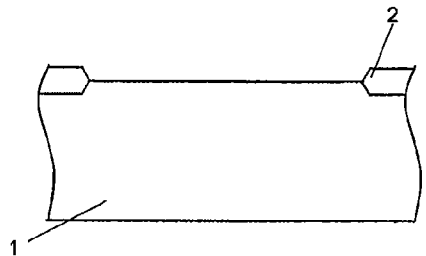
FIGS. 1A to 1H are schematic sectional views of a process sequence flow showing a first embodiment of the present invention.
Figure 1E:
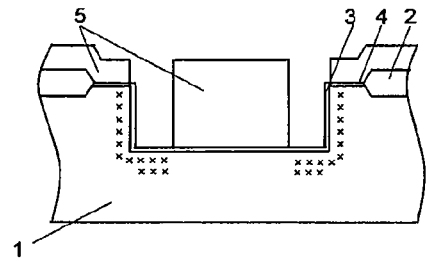
Figure 1B:
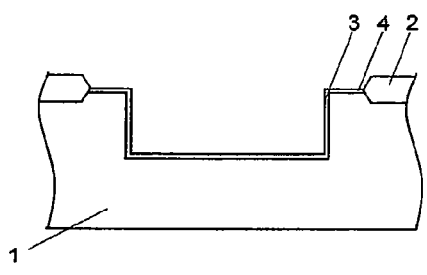

In FIG. 1A, on a first conductivity type semiconductor substrate, for example, a p-type semiconductor substrate 1, or a semiconductor substrate having an impurity concentration of a resistivity ranging from 20 Ωcm to 30 Ωcm due to addition of boron, a thick oxide film 2 by a local oxidation of silicon (LOCOS) method, such as a thermal oxide film having a thickness of 500 nm to 1 μm, is formed. The conductivity type of the substrate is not related to the essence of the present invention. As shown in FIG. 1B, a trench structure 3 is formed on the first conductivity type semiconductor substrate, for example, with a depth of several hundred nm to several μm. Then, an oxide film 4 is formed, for example, in a thickness of several hundred Å.

Figure 1F:
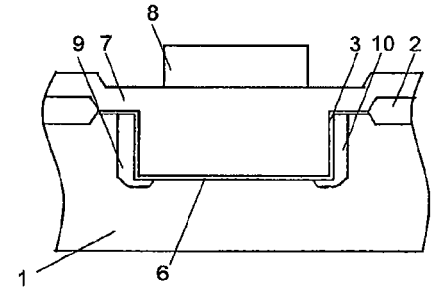
Figure 1C:
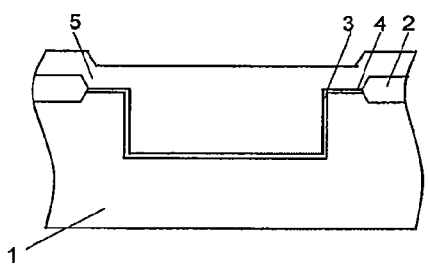
Figure 1G:
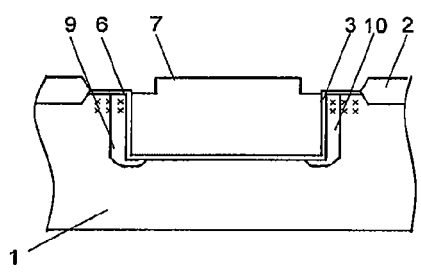
Figure 1D:
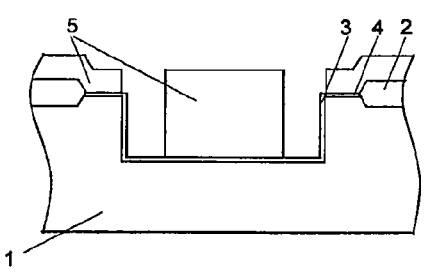

After that, as shown in FIG. 1C, a resist film 5 is applied, and, as shown in FIG. 1D, the resist film 5 is removed in a source region and a drain region by patterning so that impurity addition to the source region and the drain region can be effected from a top surface of the trench structure 3 to a bottom surface thereof or up to a deeper position. Instead of the resist film 5, a nitride film or a polycrystalline silicon film can be used as a mask for patterning. After that, as shown in FIG. 1E, an impurity such as arsenic is ion-implanted preferably at a dosage of $1\times10^{13}$ atoms/cm$^2$ to $1\times10^{16}$ atoms/cm$^2$ by spinning (turning) a wafer.

Figure 2A:
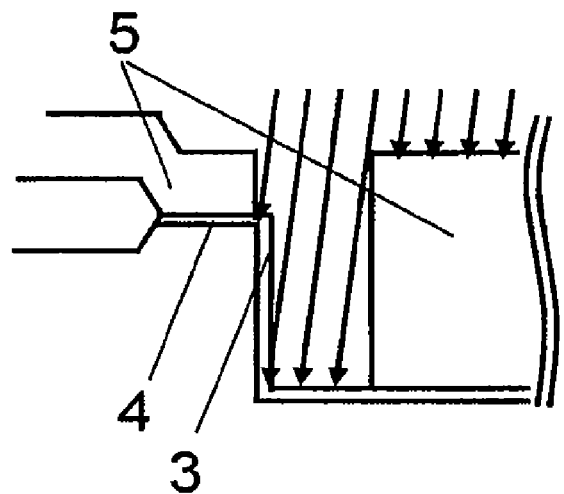
FIGS. 2A and 2B are schematic views of an ion implantation step in the schematic sectional views of the process sequence flow showing the first embodiment of the present invention.
Figure 2B:
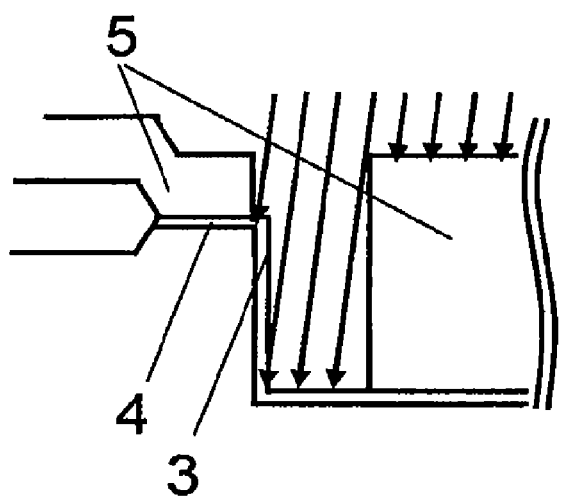
Figure 3A:
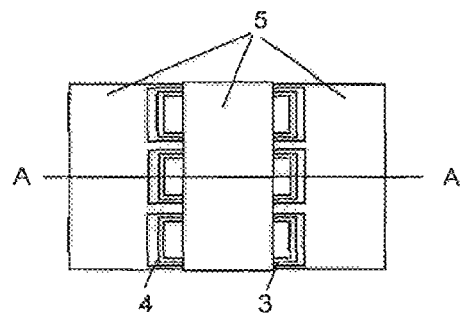
FIGS. 3A and 3B are schematic plan views and FIGS. 3C and 3D are schematic sectional views showing a semiconductor device obtained in the first embodiment and a second embodiment of the present invention.

FIGS. 2A and 2B describe this step in detail. FIGS. 2A and 2B are schematic views showing the ion implantation step of FIG. 1E. FIG. 2A shows a source region side and FIG. 2B shows a drain region side when the wafer is turned 180 degrees with respect to FIG. 2A. As shown in FIG. 2A, an impurity is added to a side surface of the trench structure 3 and a bottom surface thereof, and ion implantation is performed at a low incident angle of ion implantation while spinning (turning) the wafer. Accordingly, as shown in FIG. 2B, introduction of the impurity can also be performed on the drain region from a side surface to a bottom surface thereof, which is located in an opposite side of the resist film 5 being on the source region side. FIG. 3A is a plan view of the device shown by FIG. 1E, which is an A-A sectional view showing an A-A portion shown in FIG. 3A. The resist film 5 and the oxide film 4 are later removed.

Subsequently, as shown in FIG. 1F, a gate insulating film 6 is formed of a thermal oxide film having a thickness of several hundred to several thousand Å, for example. Then, a polycrystalline silicon gate film is deposited on the gate insulating film 6 preferably in a thickness of 100 nm to 500 nm, and an impurity is introduced by predeposition or an ion implantation method to obtain a gate electrode 7. Here, the impurity introduced by the ion implantation is diffused and activated simultaneously in the formation of the gate insulating film 6 which is a thermal oxide film. In this step, both of a source region 9 and a drain region 10 where the impurity is diffused are further diffused from the top surface of the trench structure 3 to a bottom portion thereof or a deeper position. In addition, in the case where the impurity introduction by the ion implantation described above is performed at high concentration, the thermal oxide film formed on each surface of the source region 9 and the drain region 10 becomes thick. Accordingly, capacitance between the gate and the drain can be automatically reduced.

Figure 1H:
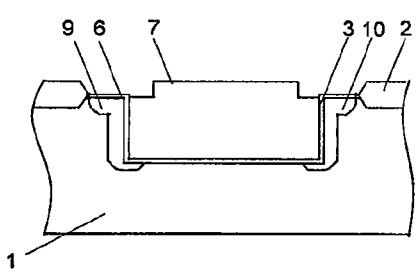

On the other hand, the gate electrode 7 is patterned with a resist film 8 to obtain the structure shown in FIG. 1G. Subsequently, as shown in FIG. 1G, impurity addition is performed to form a source region and a drain region in a self-alignment manner with respect to the gate electrode 7. In the impurity addition to the source region and the drain region, for example, arsenic is ion-implanted preferably at a dosage of $1\times10^{15}$ atoms/cm$^2$ to $1\times10^{16}$ atoms/cm$^2$. Through the above-mentioned processes, a MOS transistor having the trench structure 3 is configured. As shown in FIG. 1H, heat treatment at 800° C. to 1,000° C. for several hours, then, forms the source region 9 and the drain region 10.

As a second embodiment of the present invention, the impurity addition as described above to the source region 9 and the drain region 10 so as to be deeply effected from the top surface of the trench structure 3 to the bottom portion thereof or a deeper position can be performed after the formation of the gate insulating film 6.

Figure 3B:
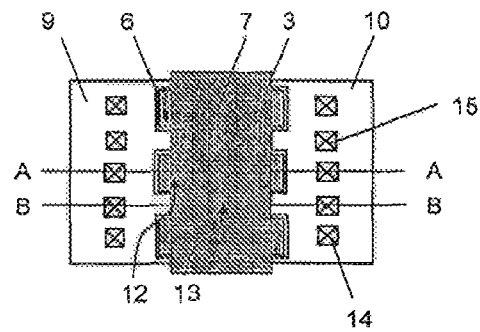
Figure 3C:
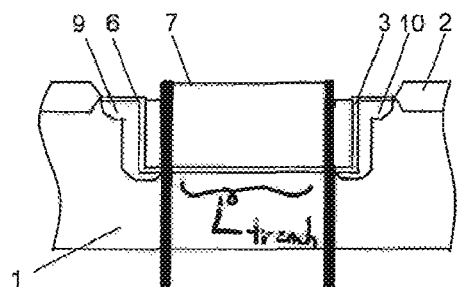
Figure 3D:
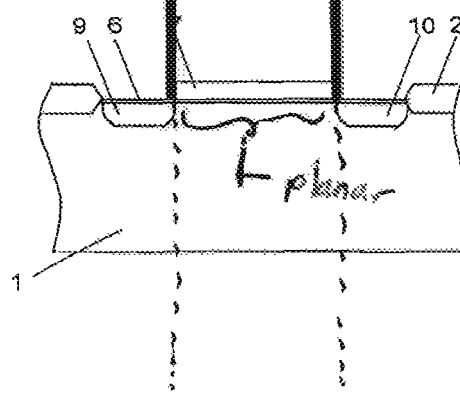

FIG. 3B shows a plan view of the semiconductor device obtained in the above-mentioned first embodiment or the second embodiment of the present invention. FIG. 3C is an A-A sectional view taken along the line A-A of FIG. 3B, and FIG. 3D is a B-B sectional view taken along the line B-B of FIG. 3B, respectively. With reference to FIG. 3C, in a trench portion transistor 12 having the trench structure 3, a diffusion region is formed in the source region 9 and the drain region 10 in the vicinity of the gate electrode 7 from the top surface of the trench structure 3 to the bottom portion thereof or a deeper position. Meanwhile, with reference to FIG. 3D, in a planar portion transistor 13, the diffusion region is entirely formed with a substantially equal depth in the source region 9 and the drain region 10 in the vicinity of the gate electrode 7.

Figure 5:
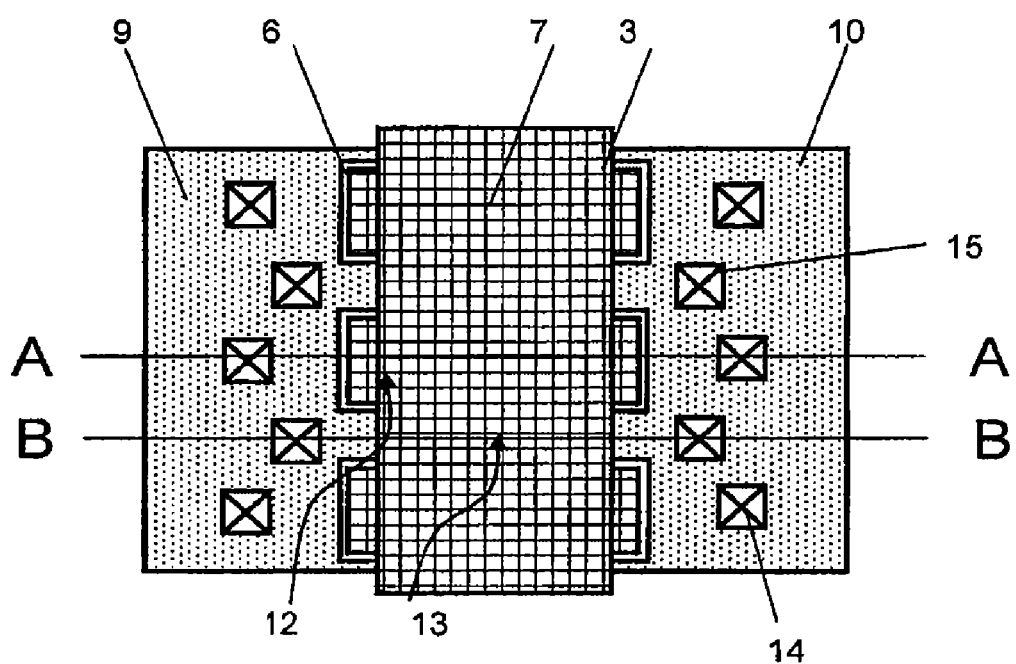
FIG. 5 is a schematic plan view of a semiconductor device obtained in a third embodiment of the present invention.

FIG. 5 is a schematic plan view of a semiconductor device obtained in a third embodiment of the present invention. FIG. 5 is different from FIG. 3B in position of contacts on the source region and the drain region. In FIG. 3B, trench portion contacts and planar portion contacts are arranged in a line.

However, in this embodiment, in order to reduce a parasitic resistance, a distance between a planar portion contact 15 and the gate electrode 7 is shorter than a distance between a trench portion contact 14 and the gate electrode.

As described above, in the present invention, the diffusion region is formed from the top surface of the trench structure 3 to the bottom portion thereof or a deeper position, in the trench portion transistor 12 having the trench structure. Accordingly, current concentration at the top of a concave portion having a continually varying depth in a gate width direction can be reduced, and the current can flow also along a side surface and a bottom surface of the trench portion, enhancing the driving performance of the semiconductor device.

What is claimed is:

1. A method of manufacturing a semiconductor device comprising:
   preparing a semiconductor substrate having a first conductivity type;
   removing a portion of the semiconductor substrate to form a channel region and forming a trench portion having a side surface and a bottom surface wherein a planar portion is disposed in the semiconductor substrate other than the trench portion;
   forming an oxide film on a surface of the trench portion and a surface of the planar portion;
   applying a resist material and patterning the resist material such that an impurity can be introduced through the trench portion in a source region direction and a drain region direction;
   prior to forming a gate electrode, ion-implanting an impurity having a second conductivity type in the source region direction and in the drain region direction using the resist material as a mask to form a source region and a drain region;
   removing the resist material and the oxide film and forming a gate insulating film;
   depositing polycrystalline silicon to form the gate electrode on the gate insulating film;
   patterning the gate electrode to entirely occupy a cavity defined by the side surface and the bottom surface of the trench portion and the planar portion, the gate electrode having a varying gate length dimension, such that the gate length of a first transistor portion in the cavity is longer than the gate length of a second transistor portion on the planar portion; and
   performing heat treatment for diffusion and activation of the source region and the drain region from the side surface of the trench portion down to the bottom surface.

2. A method of manufacturing a semiconductor device according to claim 1, wherein the source region and the drain region are ion-implanted at a dosage of $1\times10^{13}$ atoms/cm$^2$ to $1\times10^{16}$ atoms/cm$^2$.

3. A method of manufacturing a semiconductor device according to claim 1, wherein the impurity diffusion and the activation of the source region and the drain region are performed at the same time with the formation of the gate insulating film.

4. A semiconductor device comprising:
   a first conductivity type semiconductor substrate having a trench therein extending in a gate width direction and having a planar surface adjacent to the trench;
   a gate insulating film overlying the planar surface and the trench;
   a patterned gate electrode having a varying gate length dimension, the gate electrode overlying the gate insulating film and occupying the entire trench and having a portion overlying the planar surface;
   a source region of a second conductivity type residing in a first planar portion of the substrate on one side of the gate electrode; and
   a drain region of the second conductivity type residing in a second planar portion of the substrate on the other side of the gate electrode,
   wherein at least a portion of the source region and at least a portion of the drain region reside in wall surfaces of the trench and face each other on opposite sides of the trench and have a depth from a top surface of the trench to one of a bottom portion thereof or a deeper position,
   such that the gate length of a first transistor residing on the planar surface of the substrate is less than the gate length of a second transistor residing in the trench,
   wherein a distance between the gate electrode and a planar portion contact on a surface of one of the source region and the drain region is shorter than a distance between the gate electrode and a trench portion contact on the surface of one of the source region and the drain region;
   wherein the trench portion contact is in line with the trench and the planar portion contact is in line with the planar surface.

5. A semiconductor device according to claim 4 further comprising a second trench separated from the trench by the planar surface of, wherein a second portion of the first transistor portion resides in the second trench.

6. A semiconductor device comprising:
   a first conductivity type semiconductor substrate;
   a trench structure formed in the first conductivity type semiconductor substrate in a gate width direction, the trench structure comprising a cavity and having a planar surface;
   a gate insulating film overlying the planar surface of the trench structure;
   a gate electrode comprising a patterned structure that occupies the entire cavity defined by the trench structure and formed on the planar surface via the gate insulating film, the gate electrode having a varying gate length dimension;
   a source region of a second conductivity type residing in the substrate on one side of the gate electrode; and
   a drain region of the second conductivity type residing in the substrate on the other side of the gate electrode,
   wherein at least a portion of the source region and at least a portion of the drain region sandwich the trench structure and face each other, and have a depth from a top surface of the trench structure to one of a bottom portion thereof or a deeper position, and
   the gate length of a first transistor portion in the cavity is longer than the gate length of a second transistor portion on the planar surface,
   wherein the source region and the drain region comprise an impurity added before formation of the gate electrode and define a channel region therebetween, and
   wherein a portion of the gate insulating film overlying the source and the drain regions is thicker than a portion of the gate insulating film overlying the channel region under the gate electrode,
   wherein a distance between the gate electrode and a planar portion contact on a surface of one of the source region and the drain region is shorter than a distance between the gate electrode and a trench portion contact on the surface of one of the source region and the drain region;

wherein the trench portion contact is in line with the cavity of the trench structure and the planar portion contact is in line with the planar surface.

7. A semiconductor device comprising:

a first conductivity type semiconductor substrate;

a source region of a second conductivity type and a drain region of the second conductivity type, which are disposed apart from each other in a vicinity of a surface of the first conductivity type semiconductor substrate;

a planar portion disposed between the source region and the drain region comprising a first channel region;

a trench portion with a constant depth disposed along with the planar portion and having a side surface and a bottom surface comprising a second channel region;

a gate insulating film overlying a surface of the planar portion and a surface of the trench portion; and a gate electrode provided on the gate insulating film and comprising a patterned structure that entirely occupies a cavity defined by the trench portion and overlies the planar portion, the gate electrode having a varying gate length dimension, wherein at least a portion of the source region and at least a portion of the drain region which face each other via the trench portion and comprise a diffusion region having a depth from a top surface of the trench structure to one of a bottom portion thereof or a deeper position, and the gate length of a first transistor portion in the cavity is longer than the gate length of a second transistor portion on the planar portion, wherein the source region and the drain region comprise an impurity added before formation of the gate electrode; and wherein a portion of the gate insulating film overlying the source and the drain regions is thicker than a portion of the gate insulating film overlying the second channel region under the gate electrode, wherein a distance between the gate electrode and a planar portion contact on a surface of one of the source region and the drain region is shorter than a distance between the gate electrode and a trench portion contact on the surface of one of the source region and the drain region;

wherein the trench portion contact is in line with the trench portion and the planar portion contact is in line with the planar portion.

* * * * *

UNITED STATES PATENT AND TRADEMARK OFFICE
CERTIFICATE OF CORRECTION

PATENT NO. : 8,236,648 B2
APPLICATION NO. : 12/178328
DATED : August 7, 2012
INVENTOR(S) : Masayuki Hashitani It is certified that error appears in the above-identified patent and that said Letters Patent is hereby corrected as shown below:

In the Claims

In column 6, claim 5, line 28, before "wherein a second portion of" replace "surface of," with --surface,--.

Signed and Sealed this
Twenty-seventh Day of November, 2012

David J. Kappos
*Director of the United States Patent and Trademark Office*